(12) United States Patent
Kawamori et al.

(10) Patent No.: US 12,089,317 B2
(45) Date of Patent: Sep. 10, 2024

(54) LOCATION IDENTIFICATION SYSTEM, LOCATION IDENTIFICATION METHOD, AND COMPUTER-READABLE MEDIUM

(71) Applicant: NEC Platforms, Ltd., Kawasaki (JP)

(72) Inventors: Masami Kawamori, Kanagawa (JP); Tatsuyuki Yazawa, Kanagawa (JP); Atsushi Ikeda, Kanagawa (JP); Masanao Sasaki, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 372 days.

(21) Appl. No.: 17/434,506

(22) PCT Filed: Jan. 21, 2020

(86) PCT No.: PCT/JP2020/001855
§ 371 (c)(1),
(2) Date: Mar. 9, 2022

(87) PCT Pub. No.: WO2020/179253
PCT Pub. Date: Sep. 10, 2020

(65) Prior Publication Data
US 2022/0225488 A1  Jul. 14, 2022

(30) Foreign Application Priority Data
Mar. 1, 2019 (JP) .................. 2019-037460

(51) Int. Cl.
*H05B 47/00* (2020.01)
*H03K 5/02* (2006.01)
(Continued)

(52) U.S. Cl.
CPC ............... *H05B 47/19* (2020.01); *H03K 5/02* (2013.01); *H05B 47/11* (2020.01); *H05K 5/02* (2013.01)

(58) Field of Classification Search
CPC ...... H05B 47/19; H05B 47/11; H05B 47/105; H05B 47/135; H05B 47/155; H05B 47/185; H05B 47/195
See application file for complete search history.

(56) References Cited

U.S. PATENT DOCUMENTS

| | | | |
|---|---|---|---|
| 8,022,632 B2 * | 9/2011 | Schulz | G01J 3/51 315/307 |
| 2013/0119133 A1 * | 5/2013 | Michael | G06K 7/01 235/439 |
| 2018/0165481 A1 * | 6/2018 | Doescher | G06K 19/0707 |

FOREIGN PATENT DOCUMENTS

| | | |
|---|---|---|
| JP | H03-124295 U | 12/1991 |
| JP | 2003-216765 A | 7/2003 |

(Continued)

OTHER PUBLICATIONS

International Search Report for PCT Application No. PCT/JP2020/001855, mailed on Mar. 3, 2020.

(Continued)

*Primary Examiner* — Tuan T Lam

(57) ABSTRACT

A location identification system (1) of the present invention includes a plurality of lighting apparatuses (50a1), . . . , (50c3) installed above a plurality of products displayed inside a room, a search apparatus (20) configured to allow a customer to search for and designate the product, and a management apparatus (10) capable of communicating with the plurality of lighting apparatuses (50a1), . . . , (50c3) and the search apparatus (20). The search apparatus (20) transmits identification information of a target product that is designated by the customer to the management apparatus (10). The management apparatus (10) changes, in a case where the identification information of the target product is received from the search apparatus (20), an emission color (Continued)

of a lighting apparatus (50*a*1), . . . , (50*c*3) associated with the target product to a pre-specified emission color.

6 Claims, 13 Drawing Sheets

(51) Int. Cl.
*H05B 47/11* (2020.01)
*H05B 47/19* (2020.01)
*H05K 5/02* (2006.01)

(56) References Cited

FOREIGN PATENT DOCUMENTS

| JP | 2016-169080 A | | 9/2016 |
|---|---|---|---|
| KR | 20150139760 A | * | 12/2015 |

OTHER PUBLICATIONS

JP Office Communication for JP Application No. 2019-037460 mailed on Oct. 6, 2020 with English Translation.

* cited by examiner

<ASSOCIATION TABLE>

| LIGHTING APPARATUS | STORE SHELF | PRODUCT | |
| --- | --- | --- | --- |
| | | PRODUCT NAME | PRODUCT CODE |
| A-1 | SA-1 | a1 | 10001 |
| A-2 | SA-2 | a2 | 10002 |
| ⋮ | ⋮ | ⋮ | ⋮ |
| C-3 | SC-1 | c2 | 10009 |

Fig. 3

<LIGHTING-APPARATUS MANAGEMENT TABLE>

| LIGHTING APPARATUS | EMISSION COLOR | ELAPSED TIME (s) |
|---|---|---|
| A-1 | WHITE | 0 |
| A-2 | RED | 45 |
| A-2 | BLUE | 15 |
| ⋮ | ⋮ | ⋮ |
| C-3 | WHITE | 0 |

Fig. 4

800
PRODUCT "A2" IS ON STORE SHELF SA-2.
LIGHTING APPARATUS ABOVE STORE
SHELF SA-2 WILL BE LIGHTED
IN RED 
810
PRODUCT "A2" IS ON STORE SHELF SA-2.
LIGHTING APPARATUS ABOVE STORE
SHELF SA-2 WILL BE LIGHTED
IN RED AND BLUE 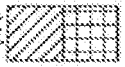
Fig. 8

1200
PRODUCT "A2" IS ON STORE SHELF SA-2.
LIGHTING APPARATUS ABOVE STORE
SHELF SA-2 WILL BE LIGHTED
IN RED 
PLEASE PRESS THE KEY BELOW
UPON ARRIVAL.
ARRIVED
1210
PRODUCT "A2" IS ON STORE SHELF SA-2.
LIGHTING APPARATUS ABOVE STORE
SHELF SA-2 WILL BE LIGHTED
IN RED AND BLUE
PLEASE PRESS THE KEY BELOW
UPON ARRIVAL.
ARRIVED
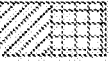
Fig. 12

<LIGHTING-APPARATUS MANAGEMENT TABLE>

| LIGHTING APPARATUS | EMISSION COLOR | MOBILE TERMINAL APPARATUS ID |
|---|---|---|
| A-1 | WHITE | — |
| A-2 | RED | xxxxxxxx |
| ⋮ | ⋮ | ⋮ |
| C-3 | WHITE | — |

Fig. 13

LOCATION IDENTIFICATION SYSTEM, LOCATION IDENTIFICATION METHOD, AND COMPUTER-READABLE MEDIUM

This application is a National Stage Entry of PCT/JP2020/001855 filed on Jan. 21, 2020, which claims priority from Japanese Patent Application 2019-037460 filed on Mar. 1, 2019, the contents of all of which are incorporated herein by reference, in their entirety.

TECHNICAL FIELD

The present invention relates to a location identification system, a location identification method, and a computer-readable medium, and more particularly, to a location identification system, a location identification method, and a computer-readable medium for allowing a customer to identify the location of a product.

BACKGROUND ART

Conventionally, it has been an adopted style to display various products on shelves for sale. In a store that handles a large number of products, a problem is that the products are arranged on a plurality of store shelves, and thus customers cannot easily identify the locations of the products.

In this connection, for example, a search system disclosed in Patent Literature 1 is intended to project a guide image for guiding a user to a bookshelf where a target book is stored, on a floor surface of a route from the book to the bookshelf, and to guide the user to the location of the target book.

CITATION LIST

Patent Literature

Japanese Unexamined Patent Application Publication No. 2016-169080

SUMMARY OF INVENTION

Technical Problem

However, a problem with the search system disclosed in Patent Literature 1 is that the user cannot immediately grasp the location of the target book if the target book is in a blind spot of the user because the guide image composed of an arrow is projected on the floor surface and therefore convenience is low. Another problem is that, in the case where a plurality of users uses the search system at the same time, a plurality of routes may be projected on the floor surface, and each user cannot understand which route to follow and therefore convenience is low.

In view of the situations described above, an object of the present invention is to provide a location identification system, a location identification method, and a computer-readable medium that are capable of increasing convenience when customers attempt to identify the locations of products.

Solution to Problem

A location identification system according to an example aspect of the present invention includes a plurality of lighting apparatuses installed above a plurality of products displayed inside a room, a search apparatus configured to allow a customer to search for and designate the product, and a management apparatus capable of communicating with the plurality of lighting apparatuses and the search apparatus. The search apparatus transmits identification information of a target product that is designated by the customer to the management apparatus. The management apparatus changes an emission color of a lighting apparatus associated with the target product to a pre-specified emission color in a case where the management apparatus receives the identification information of the target product from the search apparatus.

Advantageous Effects of Invention

According to the present invention, there may be provided a location identification system, a location identification method, and a computer-readable medium that are capable of increasing convenience when customers attempt to identify the locations of products.

BRIEF DESCRIPTION OF THE DRAWINGS

FIG. 3 is a diagram showing an example of an association table according to the first example embodiment of the present invention.

FIG. 4 is a diagram showing an example of a lighting-apparatus management table according to the first example embodiment of the present invention.

FIG. 8 is a diagram showing examples of GUIs that are displayed by a search apparatus according to the first example embodiment of the present invention.

FIG. 12 is a diagram showing examples of GUIs that are displayed by a search apparatus according to the second example embodiment of the present invention.

FIG. 13 is a diagram showing an example of a lighting-apparatus management table according to the second example embodiment of the present invention.

DESCRIPTION OF EMBODIMENTS

First Example Embodiment

Figure 1:
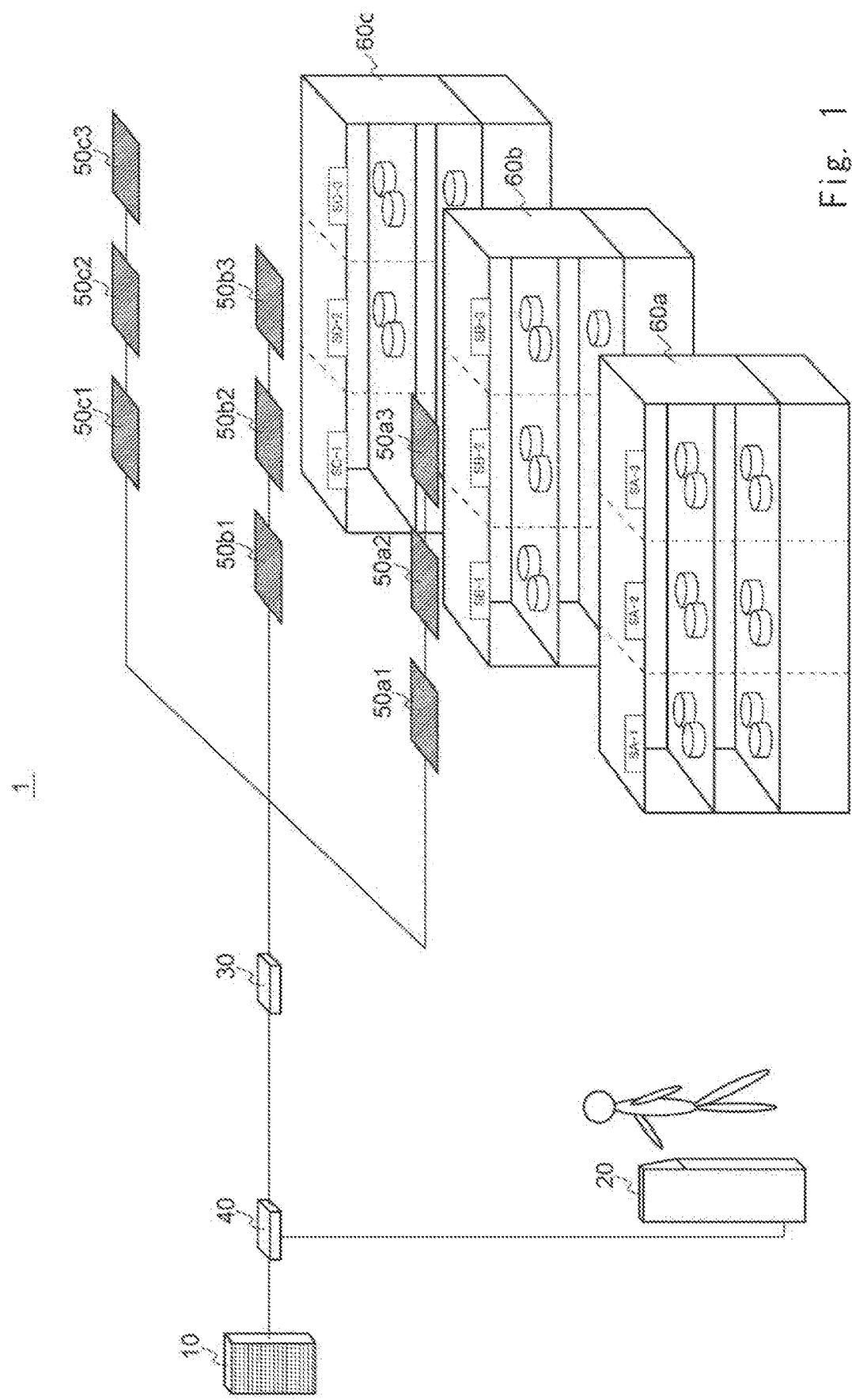
FIG. 1 is a perspective view schematically showing a location identification system according to a first example embodiment of the present invention.

In the following, a first example embodiment of the present invention will be described with reference to the drawings. FIG. 1 is a perspective view schematically showing a location identification system 1 according to the first example embodiment of the present invention. The location identification system 1 includes a management apparatus 10, a search apparatus 20, a light control apparatus 30, a router 40, and lighting apparatuses 50a1, . . . , 50c3. The management apparatus 10, the search apparatus 20, the light control apparatus 30, and the router 40 are connected to a communication cable, and the management apparatus 10, the search apparatus 20, and the light control apparatus 30 are capable of performing data communication with each other via the router 40. The light control apparatus 30 and the lighting apparatuses 50a1, . . . , 50c3 are connected to the communication cable, and are capable of performing data communication with each other. A plurality of products is displayed on store shelves 60a, . . . , 60c.

The management apparatus 10 is an information processing apparatus that controls the search apparatus 20 and the light control apparatus 30. Functions of the management apparatus 10 will be described later with reference to FIG. 2.

The search apparatus 20 is an apparatus that is used by a customer to grasp the location of a product, and is installed inside a room where the products are displayed. The search apparatus 20 includes a function of displaying information about a product, a function of searching for a product that is designated by the customer, and a function of providing information indicating the location of the product, and displays graphical user interfaces (GUIs) corresponding to these functions on a display device that the search apparatus is provided with.

The light control apparatus 30 is an apparatus that controls light emission states of the lighting apparatuses 50a1, . . . , 50c3. The light control apparatus 30 transmits a control signal corresponding to a control command provided by the management apparatus 10 to the lighting apparatus 50a1, . . . , 50c3, and changes an emission color of the lighting apparatus 50a1, . . . , 50c3. The router 40 is a relay apparatus that relays data that is communicated between the management apparatus 10, the search apparatus 20, and the light control apparatus 30.

The lighting apparatuses 50a1, . . . , 50c3 are each a lighting apparatus that includes light-emitting bodies such as LEDs, and that changes emission colors of the light-emitting bodies according to a control signal provided by the light control apparatus 30. The lighting apparatuses 50a1, . . . , 50c3 are installed above a plurality of products that are displayed inside a room or around positions above the products. For example, the lighting apparatuses 50a1, . . . , 50c3 may be installed on a ceiling of the room where the products are present. The lighting apparatuses 50a1, . . . , 50c3 are each installed on the ceiling and function as an indoor lighting apparatus for illuminating the inside of the room, and as a lighting apparatus for indicating the location of a product. That is, one or some or all of the indoor lighting apparatuses that are installed on the ceiling and that illuminate the inside of the room may be used as the lighting apparatus for indicating the location of a product. Furthermore, the lighting apparatuses 50a1, . . . , 50c3 may be lighting apparatuses that are attached to rails installed above the store shelves 60a, . . . , 60c. Furthermore, the lighting apparatuses 50a1, . . . , 50c3 may be provided on the ceiling or on rails installed above the store shelves 60a, . . . , 60c, separately from an indoor lighting apparatus for illuminating the inside of the room. The light-emitting bodies of the lighting apparatuses 50a1, . . . , 50c3 are capable of emitting light in various colors (such as red, blue, yellow, green, orange, and pink), and the lighting apparatuses 50a1, . . . , 50c3 may cause the light-emitting bodies to emit light in an emission pattern including one of the colors mentioned above, an emission pattern including two of the colors mentioned above (such as a checkered pattern in red and blue, a checkered pattern in red and yellow, a checkered pattern in red and green, or a checkered pattern in red and orange), or any emission pattern combining the colors mentioned above in various ways.

Figure 2:
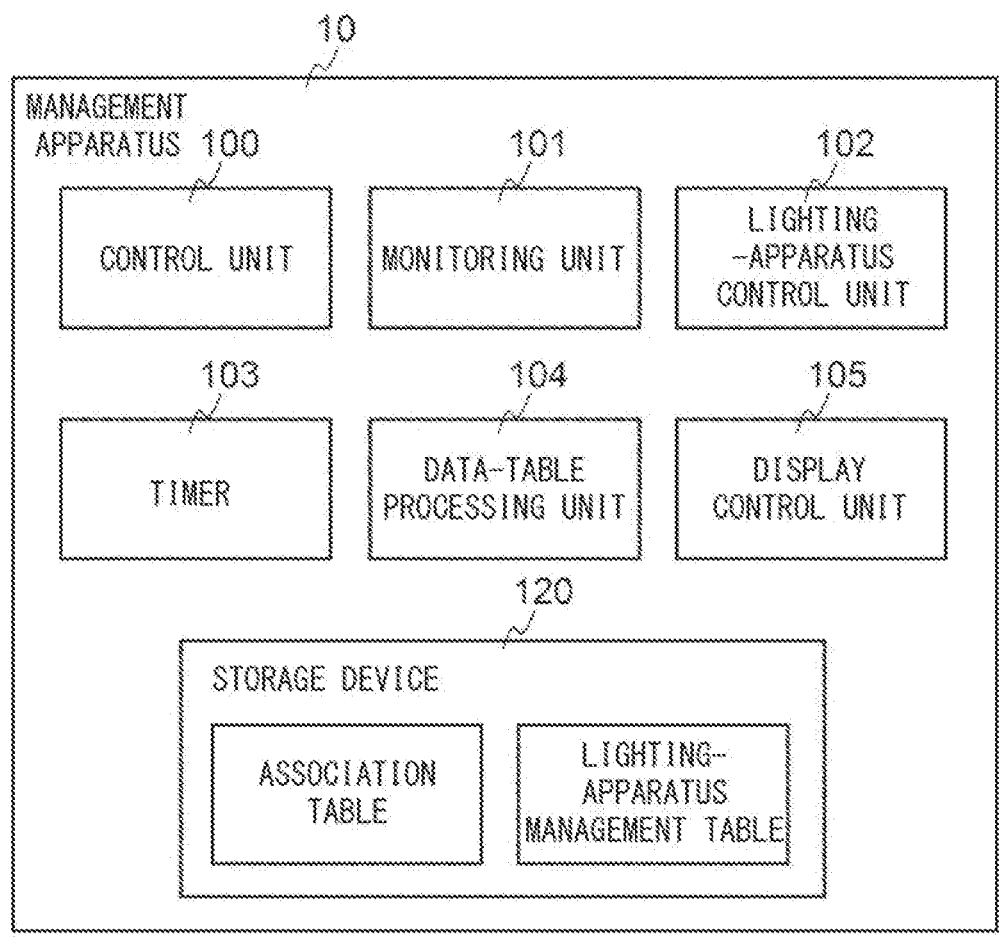
FIG. 2 is a diagram showing a configuration of a management apparatus according to the first example embodiment of the present invention.

FIG. 2 is a diagram showing a configuration of the management apparatus 10 according to the first example embodiment of the present invention. The management apparatus 10 includes a central processing unit (CPU; not shown) that is an arithmetic unit, and performs a location identification method of the present invention by executing a location identification program of the present invention that is stored in a storage device 120. The location identification program of the present invention includes a control unit 100, a monitoring unit 101, a lighting-apparatus control unit 102, a timer 103, a data-table processing unit 104, and a display control unit 105 that are program modules.

The control unit 100 is a program module for performing overall control of the management apparatus 10, and the control unit 100 executes the location identification program of the present invention by invoking other program modules as necessary. The monitoring unit 101 is a program module for monitoring reception/non-reception of identification information of a product from the search apparatus 20. The lighting-apparatus control unit 102 is a program module for changing the emission colors of the lighting apparatuses 50a1, . . . , 50c3 using the light control apparatus 30. The timer 103 is a program module for measuring an elapsed time.

The data-table processing unit 104 is a program module for processing an association table and a lighting-apparatus management table saved in the storage device 120. As shown in FIG. 3, the association table is a data table in which identification information of a lighting apparatus, identification information of a store shelf installed below the lighting apparatus, and identification information (a product name and a product code) of a product displayed on the store shelf are registered in association with one another.

As shown in FIG. 4, the lighting-apparatus management table is a data table in which the identification information of a lighting apparatus, a current emission color of the lighting apparatus, and an elapsed time from start of emission by the lighting apparatus are registered in association with one another. In the present example embodiment, the lighting apparatus may emit light in two pre-specified emission colors. In this case, the elapsed time is registered in the lighting-apparatus management table in association with each of the emission colors. Furthermore, in the present example embodiment, in the case where a product is not designated, the lighting apparatus emits light in white, and thus, "0" is registered in the lighting-apparatus management table in association with white.

The display control unit 105 is a program module for providing, to the search apparatus 20, configuration information of a GUI to be displayed on the search apparatus 20, and for causing the search apparatus 20 to display the GUI. Specifically, the display control unit 105 generates configuration information of a GUI for displaying product names registered in the association table, and transmits the configuration information of the GUI to the search apparatus 20. When a user selects a product using the GUI displayed by the search apparatus 20, the search apparatus 20 transmits the product name of the product to the management apparatus 10. The display control unit 105 refers to the association table and identifies the lighting apparatus and the store shelf that are associated with the product name, and provides configuration information of a GUI 800, 810 as shown in FIG. 8 to the search apparatus 20. The GUIs 800, 810 are examples of a GUI for indicating the location of a product designated by a customer. The GUI 800 displays information indicating the store shelf where a designated product is displayed, and information indicating the emission color of the lighting apparatus installed above the product. The GUI 810 is a GUI that is displayed in a case where the emission color of the lighting apparatus associated with the product is already changed and then a product is designated by the customer. The GUI 810 displays information indicating the store shelf where the designated product is displayed, and information indicating two emission colors of the lighting apparatus installed above the product.

The storage device 120 stores various data including the association table, the lighting-apparatus management table, the configuration information of the GUI to be provided to the search apparatus 20, the location identification program of the present invention, and the like.

Figure 5:
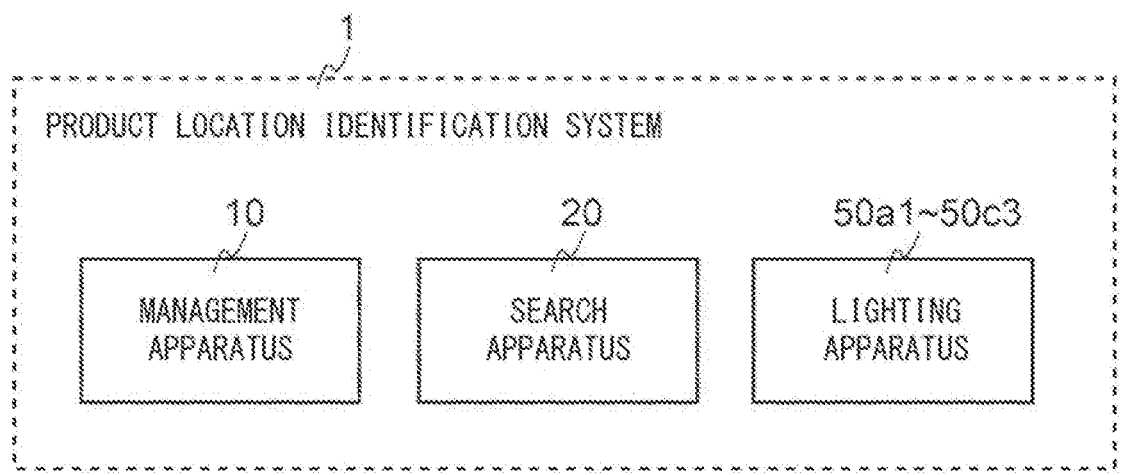
FIG. 5 is a block diagram showing main components of the location identification system according to the first example embodiment of the present invention.

FIG. 5 is a block diagram showing main components of the location identification system 1 according to the first example embodiment. As the main components, the location identification system 1 includes the management apparatus 10, the search apparatus 20, and the lighting apparatuses 50a1, . . . , 50c3.

Figure 6:
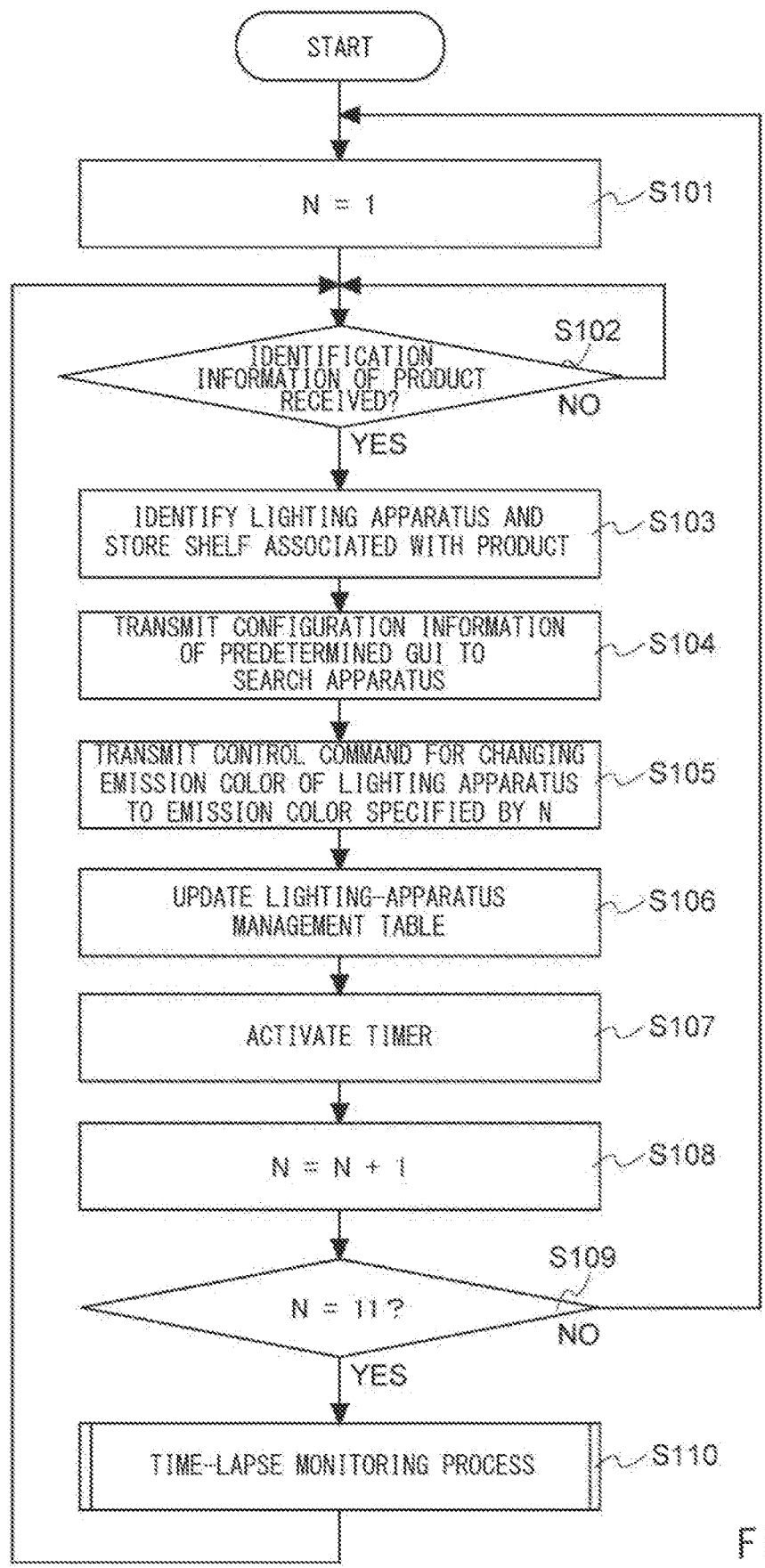
FIG. 6 is a flowchart showing an example of a process that is performed by the management apparatus according to the first example embodiment of the present invention.

FIG. 6 is a flowchart showing an example of a process that is performed by the management apparatus 10 according to the first example embodiment of the present invention. In step S101, the control unit 100 initializes a variable N to one. In step S102, the monitoring unit 101 determines whether the identification information of a product designated by a customer is received from the search apparatus 20. In the case where the identification information of a product is not received (NO), the process in step S102 is performed again. On the other hand, in the case where the identification information of a product is received (YES), the process proceeds to step S103.

In step S103, the lighting-apparatus control unit 102 refers to the association table and identifies the lighting apparatus and the store shelf that are associated with the identification information of the product. In step S104, the display control unit 105 transmits, to the search apparatus 20, the configuration information of the GUI for indicating the location of the product designated by the customer. Information indicating the store shelf where the product is displayed and information indicating that the lighting apparatus will be lighted in the emission color specified by the variable N are to be displayed on the GUI.

In step S105, the lighting-apparatus control unit 102 transmits, to the light control apparatus 30, a control command for causing the lighting apparatus to emit light in the emission color specified by the variable N, and changes the emission color of the lighting apparatus. Here, in the case where the emission color of the lighting apparatus is already changed, the lighting-apparatus control unit 102 transmits a control command for causing the lighting apparatus to emit light in both the current emission color and the emission color specified by the variable N. The lighting apparatus 50a1, . . . , 50c3 thus emits light in both the current emission color and the emission color specified by the variable N. In this case, the lighting apparatus 50a1, . . . , 50c3 may cause some of the light-emitting bodies of the lighting apparatus to emit light in the current emission color and other light-emitting bodies to emit light in the emission color specified by the variable N. Alternatively, the lighting apparatus 50a1, . . . , 50c3 may cause the light-emitting bodies to emit light alternately in the current emission color and the emission color specified by the variable N.

In step S106, the data-table processing unit 104 updates the lighting-apparatus management table by changing the emission color of the lighting apparatus registered in the lighting-apparatus management table to information indicating the emission color specified by the variable N. In step S107, the control unit 100 activates the timer 103. The timer 103 registers an elapsed time from a transmission time of the control command in the lighting-apparatus management table in association with the identification information of the lighting apparatus. In step S108, the control unit 100 increments the variable N. In step S109, the control unit 100 determines whether the variable N is a predetermined value (such as "11"). The predetermined value depends on the number of colors in which the lighting apparatus 50a1, . . . , 50c3 can emit light and the emission pattern. In the case where the variable N is not the predetermined value (NO), the process returns to step S101. On the other hand, in the case where the variable N is the same as the predetermined value (YES), the process proceeds to step S110. In step S110, the control unit 100 performs a time-lapse monitoring process shown in FIG. 7.

Figure 7:
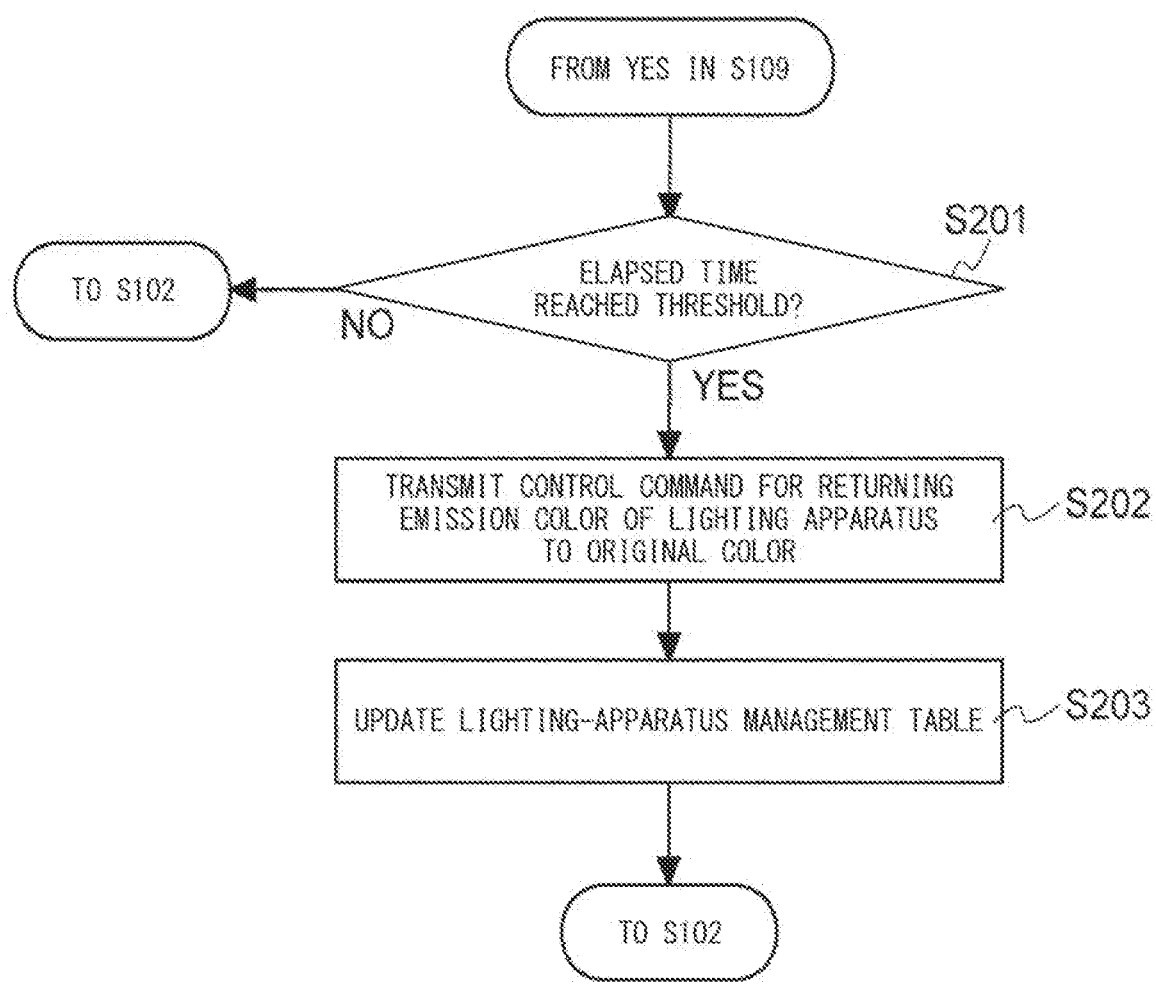
FIG. 7 is a flowchart showing an example of a time-lapse monitoring process that is performed by the management apparatus according to the first example embodiment of the present invention.

FIG. 7 is a flowchart showing an example of the time-lapse monitoring process for determining whether the elapsed time registered in the lighting-apparatus management table reached a threshold. In step S201, the control unit 100 determines whether the threshold is reached by the elapsed time registered in the lighting-apparatus management table. In the case where the threshold is not reached by the elapsed time (NO), the process returns to step S102. On the other hand, in the case where the threshold is reached by the elapsed time (YES), the process proceeds to step S202.

In step S202, the lighting-apparatus control unit 102 refers to the lighting-apparatus management table and identifies the lighting apparatus corresponding to the elapsed time, and transmits, to the light control apparatus 30, a control command for returning the emission color of the lighting apparatus to an original color. Here, in the case where the lighting apparatus is emitting light in two emission colors, the lighting-apparatus control unit 102 transmits a control command for causing the lighting apparatus to emit light in the emission color corresponding to the elapsed time that has not reached the threshold. In step S203, the data-table processing unit 104 updates the lighting-apparatus management table, and the process returns to step S102. Specifically, the data-table processing unit 104 updates the lighting-apparatus management table by changing the emission color, of the lighting apparatus, corresponding to the elapsed time registered in the lighting-apparatus management table to the original color (such as white). In the case where the lighting apparatus is emitting light in two emission colors, the lighting-apparatus control unit 102 updates the lighting-apparatus management table by deleting information corresponding to the elapsed time that reached the threshold from the lighting-apparatus management table.

In the first example embodiment, when the management apparatus 10 receives the identification information of a target product designated by a customer from the search apparatus 20, the management apparatus 10 refers to the association data table and identifies the lighting apparatus 50a1, . . . , 50c3 that is installed above the product, and changes the emission color of the lighting apparatus in question to a predetermined emission color. The customer may thus immediately grasp the location of the product that he/she designated, and convenience of the customer may be increased.

Furthermore, in the case where the management apparatus 10 receives the identification information of a product that is associated with the lighting apparatus 50$a$1, ..., 50$c$3 whose emission color is already changed, the management apparatus 10 changes the emission color of the lighting apparatus in question to the current emission color and an emission color that is different from the afore-mentioned emission color. Accordingly, in the case where a plurality of customers uses the location identification system 1 at the same time, even when products designated by the customers are associated with the same lighting apparatus or the same product is designated by the customers, each customer may accurately grasp the location of the product that he/she designated, and convenience of the customers may be increased.

Second Example Embodiment

Figure 9:
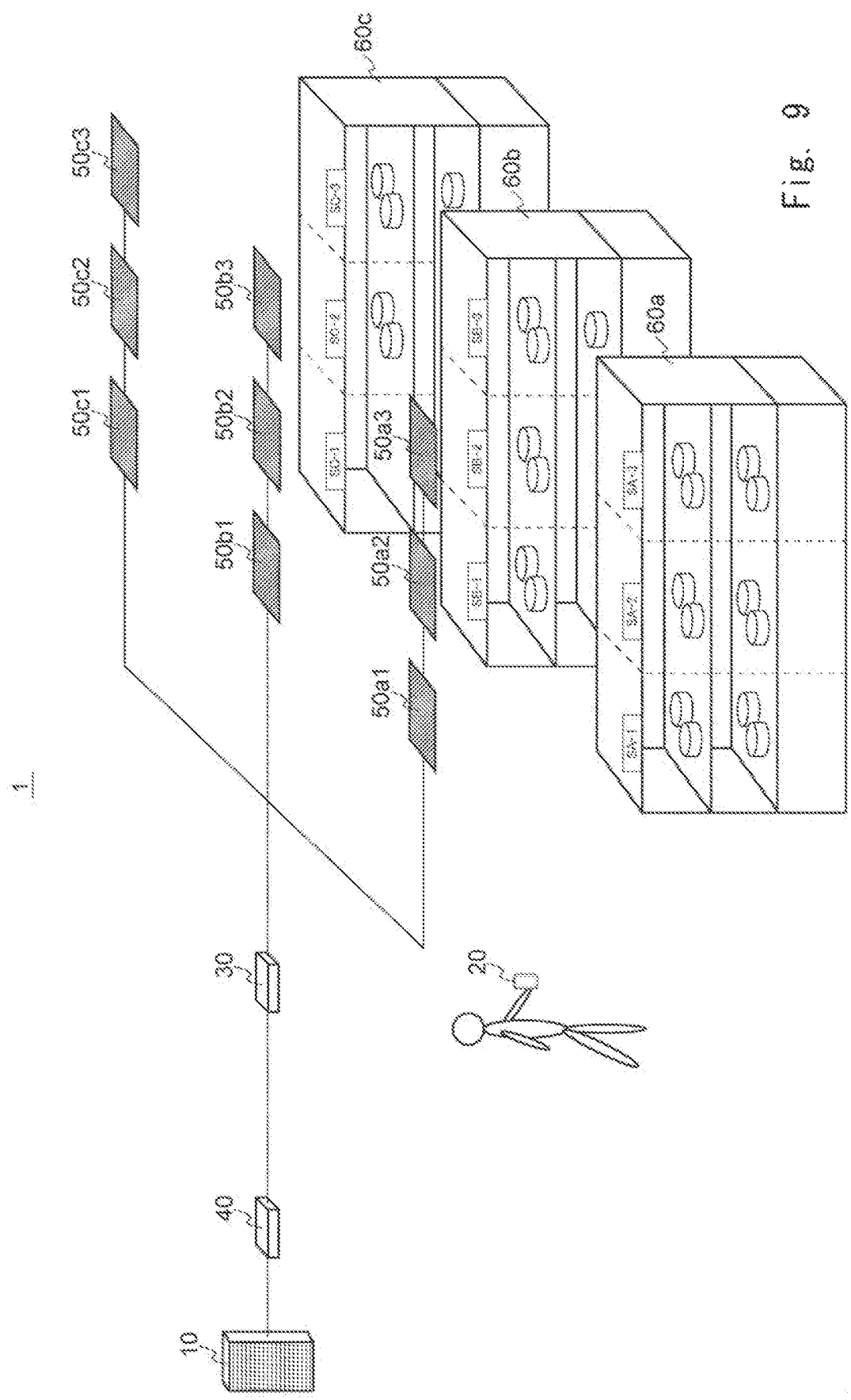
FIG. 9 is a perspective view showing a location identification system according to a second example embodiment of the present invention.

FIG. 9 is a perspective view showing the location identification system 1 according to a second example embodiment of the present invention. In the second example embodiment, a mobile terminal apparatus, such as a smartphone, carried by a customer is used as the search apparatus 20. In the second example embodiment, the router 40 includes a wireless local area network (LAN) communication function, and the search apparatus 20 may perform data communication with the management apparatus 10 by wireless LAN communication via the router 40. In the following, description of aspects that are the same as those in the first example embodiment will be omitted.

Figure 10:
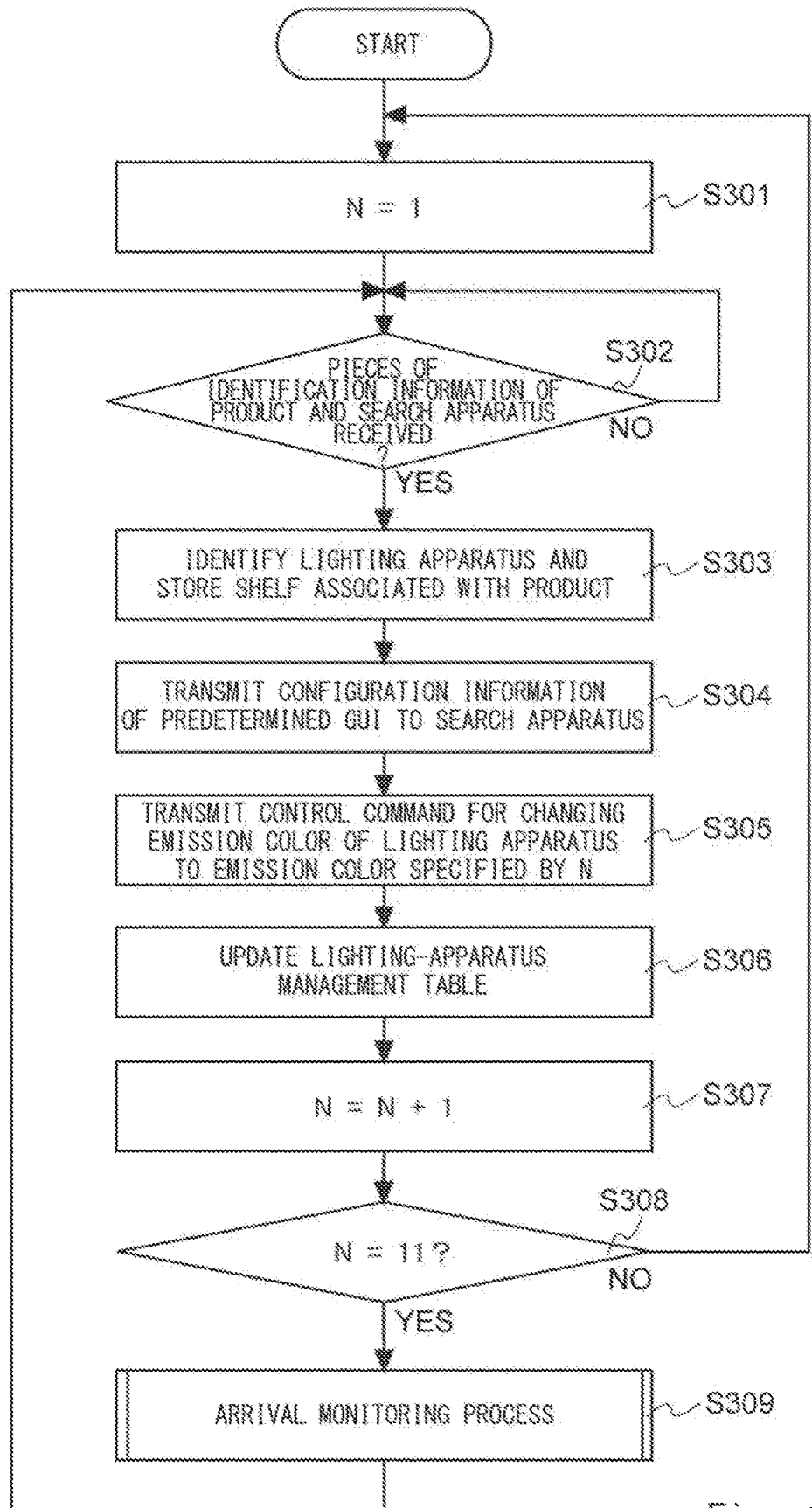
FIG. 10 is a flowchart showing an example of a process that is performed by a management apparatus according to the second example embodiment of the present invention.

FIG. 10 is a flowchart showing an example of a process that is performed by the management apparatus 10 according to the second example embodiment. In step S301, the control unit 100 initializes the variable N to one. In step S302, the monitoring unit 101 determines whether the identification information of a product designated by a customer and identification information of the search apparatus 20 of the customer are received. In the case where this identification information is not received (NO), the process in step S302 is performed again. On the other hand, in the case where this identification information is received (YES), the process proceeds to step S303.

In step S303, the lighting-apparatus control unit 102 refers to the association table and identifies the lighting apparatus and the store shelf that are associated with the product designated by the customer. In step S304, the display control unit 105 transmits, to the search apparatus 20, the configuration information of the GUI for indicating the location of the product designated by the customer. Information indicating the store shelf where the product is displayed and information indicating that the lighting apparatus will be lighted in the emission color specified by the variable N are displayed in the GUI.

FIG. 12 shows examples of the GUIs that are displayed when a product is designated by a customer. A GUI 1200 displays information indicating the store shelf where the designated product is displayed, information indicating the emission color of the lighting apparatus installed above the product, and an arrival key. When the customer presses the arrival key on the GUI 1200, the search apparatus 20 transmits, to the management apparatus 10, a notification indicating arrival of the customer (hereinafter "arrival notification") and the identification information of the search apparatus.

A GUI 1210 is a GUI that is displayed in a case where the emission color of the lighting apparatus associated with the product is already changed and then a product is designated by the customer. The GUI 1210 displays information indicating the store shelf where the designated product is displayed, information indicating two emission colors of the lighting apparatus installed above the product, and the arrival key.

In step S305, the lighting-apparatus control unit 102 transmits, to the light control apparatus 30, a control command for causing the lighting apparatus to emit light in the emission color specified by the variable N, and changes the emission color of the lighting apparatus. In step S306, the data-table processing unit 104 updates the lighting-apparatus management table. Specifically, the data-table processing unit 104 changes the emission color of the lighting apparatus registered in the lighting-apparatus management table to information indicating the emission color specified by the variable N, and also, registers the identification information of the mobile terminal apparatus as the search apparatus 20 in association with the identification information of the lighting apparatus.

In step S307, the control unit 100 increments the variable N. In step S308, the control unit 100 determines whether the variable N is a predetermined value (such as "11"). In the case where the variable N is not the predetermined value (NO), the process returns to step S301. On the other hand, in the case where the variable N is the same as the predetermined value (YES), the process proceeds to step S309. In step S309, the control unit 100 performs an arrival monitoring process shown in FIG. 11.

Figure 11:
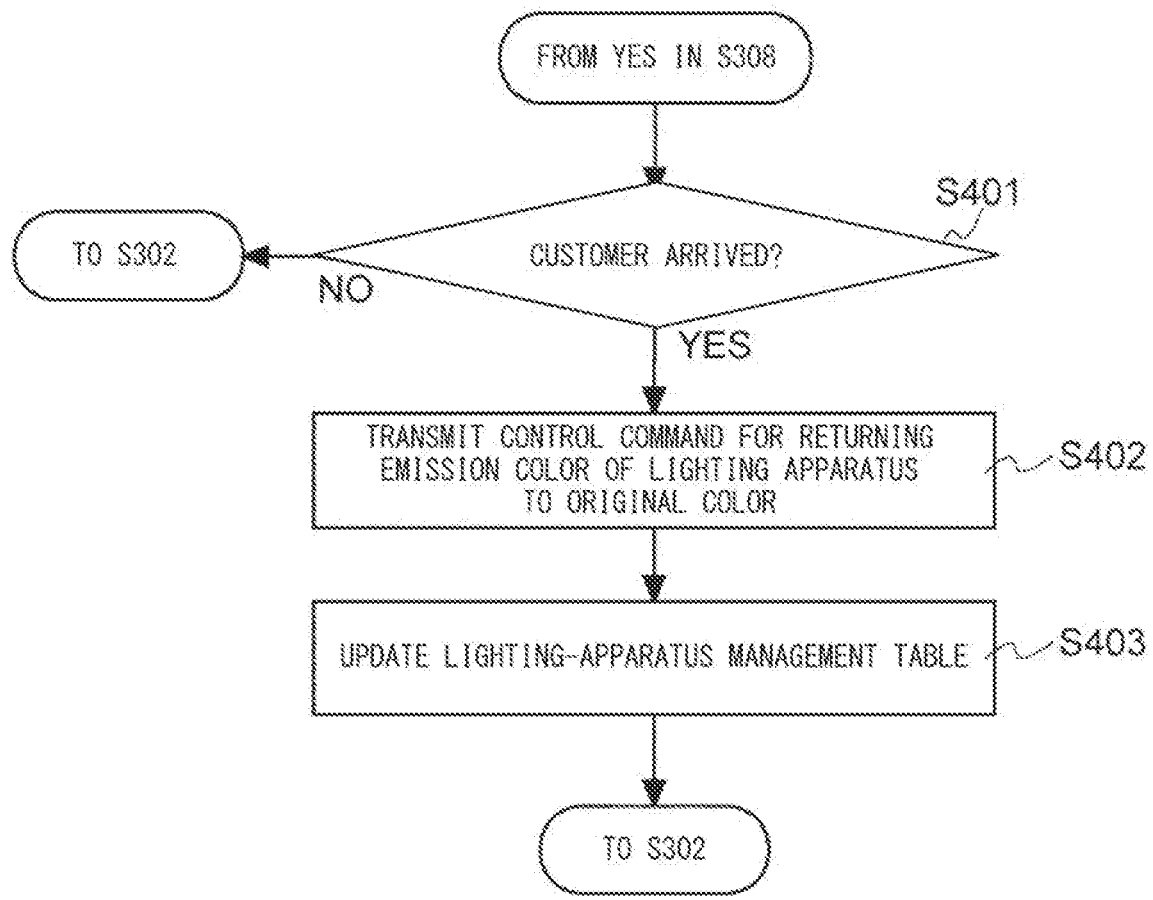
FIG. 11 is a flowchart showing an example of an arrival monitoring process that is performed by the management apparatus according to the second example embodiment of the present invention.

FIG. 11 is a flowchart showing an example of the arrival monitoring process for determining whether a customer has arrived close to the location where a designated product is displayed. In step S401, the control unit 100 determines whether a customer has arrived close to the location where a designated product is displayed. In the present example embodiment, the control unit 100 is capable of determining whether the customer has arrived or not by determined whether the arrival notification is received from the search apparatus 20. In the case where the customer has not yet arrived (NO), the process returns to step S302. On the other hand, in the case where the customer has arrived (YES), the process proceeds to step S402.

In step S402, the lighting-apparatus control unit 102 refers to the lighting-apparatus management table and identifies the lighting apparatus corresponding to the identification information of the mobile terminal apparatus, and transmits, to the light control apparatus 30, a control command for returning the emission color of the lighting apparatus to the original color. In step S403, the data-table processing unit 104 updates the lighting-apparatus management table by changing the emission color of the lighting apparatus registered in the lighting-apparatus management table to information indicating the original color (such as white), and the process returns to step S302.

In the second example embodiment, the mobile terminal apparatus, such as a smartphone, carried by a customer functions as the search apparatus 20. Accordingly, a customer may search for and designate a product using the mobile terminal apparatus that he/she possesses, and also, information indicating the location of the product is displayed on the mobile terminal apparatus, thus, convenience of the customer may be increased. Furthermore, the emission color of the lighting apparatus that is installed above the designated product may be maintained in the emission color after change, until the customer operates the mobile terminal apparatus and transmits the arrival notification to the management apparatus 10. Accordingly, convenience of the customer may be even more increased because the emission color of the lighting apparatus is not changed until the customer arrives close to the product.

Other Example Embodiments

In the second example embodiment, the control unit 100 determines whether a customer has arrived close to the location where a designated product is displayed, by determining whether the arrival notification is received from the search apparatus 20. In another example embodiment, however, the control unit 100 may determine whether the customer has arrived or not using location information of the search apparatus 20. In this case, a plurality of wireless LAN access points is installed in the room where products are displayed. And the search apparatus 20 transmits, to the management apparatus 10, intensities of radio waves received from the wireless LAN access points and identification information of the wireless LAN access points. The management apparatus 10 calculates distances between the search apparatus 20 and each wireless LAN access point by using the intensities of radio waves and the identification information of the wireless LAN access point received from the search apparatus 20, and identifies a location of the search apparatus 20 based on the distances and already-known location information of the wireless LAN access points. Then, the management apparatus 10 may determine whether the customer has arrived or not by determining whether the location of the search apparatus 20 is within a certain range of distance from the product that is designated by the customer. In this case, the management apparatus 10 holds location information of products in advance.

Furthermore, in the example embodiments described above, the management apparatus 10 and the light control apparatus 30 are configured as separate apparatuses. In another example embodiment, however, the management apparatus 10 and the light control apparatus 30 may be integrated with each other.

In the examples described above, programs may be provided to a computer by being stored in various types of computer-readable media (non-transitory computer readable media). The computer-readable media include various types of tangible storage media. Examples of the computer-readable media include magnetic recording media (such as flexible disks, magnetic tapes, and hard disk drives), magneto-optical recording media (such as magneto-optical disks), CD-ROMs, CD-Rs, CD-R/Ws, and semiconductor memories (such as mask ROMs, programmable ROMs (PROMs), erasable PROMs (EPROMs), flash ROMs, and RAMs). Furthermore, the programs may be provided to a computer by various types of transitory computer-readable media. Examples of the transitory computer-readable media include electrical signals, optical signals, and electromagnetic waves. The transitory computer-readable medium may supply the programs to a computer by a cable communication channel such as an electrical line or an optical fiber, or by a wireless communication channel.

The present invention is not limited to the example embodiments described above, and may be changed as appropriate within the scope of the present invention.

This application is based upon and claims the benefit of priority from Japanese Patent Application No. 2019-37460, filed on Mar. 1, 2019, the disclosure of which is incorporated herein in its entirety by reference.

REFERENCE SIGNS LIST

1 LOCATION IDENTIFICATION SYSTEM
10 MANAGEMENT APPARATUS
20 SEARCH APPARATUS
30 LIGHT CONTROL APPARATUS
40 ROUTER
50*a*1, . . . , 50*c*3 LIGHTING APPARATUS
60*a*, . . . , 60*c* STORE SHELF

The invention claimed is:

1. A location identification system comprising:
a plurality of lighting apparatuses installed above a plurality of products displayed inside a room; and
a management apparatus capable of communicating with the plurality of lighting apparatuses and a mobile terminal apparatus functioning as a search apparatus configured to allow a customer to search for and designate a target product of the plurality of products, wherein
the management apparatus changes an emission color of the lighting apparatus associated with the target product to a pre-specified emission color in a case where the management apparatus receives identification information of the target product that the customer designated from the mobile terminal apparatus,
the management apparatus calculates distances between the search apparatus and a plurality of wireless LAN access points installed in the room by using intensities of radio waves received from the plurality of wireless LAN access points via the mobile terminal apparatus,
the management apparatus identifies a location of the mobile terminal apparatus based on the calculated distances and already-known location information of the plurality of the wireless LAN access points,
the management apparatus determines whether the customer has arrived close to a location where the target product is displayed by determining whether the location of the mobile terminal apparatus is within a certain range of distance from the target product based on the identified location of the mobile terminal apparatus and location information of the target product,
the management apparatus returns the emission color of the lighting apparatus to an original color in a case where the management apparatus determines that the customer has arrived close to the location where the target product is displayed.

2. The location identification system according to claim 1, wherein, in a case where the emission color of the lighting apparatus associated with the target product is associated has already been changed to the pre-specified emission color, the management apparatus changes the emission color of the lighting apparatus associated with the target product to an emission color that is different from the pre-specified emission color.

3. The location identification system according to claim 1, wherein the management apparatus causes the search apparatus to display a graphical user interface (GUI), including information indicating the emission color to which the lighting apparatus associated with the target product has been changed.

4. The location identification system according to claim 1, wherein the lighting apparatus is an indoor lighting apparatus for illuminating inside of the room.

5. A location identification method performed by a management apparatus and comprising:
- receiving identification information of a target product that is designated by a customer;
- identifying a lighting apparatus that is associated with the target product, by referring to a data table associating the identification information of the target product and the lighting apparatus installed above the target product;
- changing an emission color of the lighting apparatus to a pre-specified emission color;
- calculating distances between the search apparatus and a plurality of wireless LAN access points installed in the room by using intensities of radio waves received from the plurality of wireless LAN access points via the mobile terminal apparatus;
- identifying a location of the mobile terminal apparatus based on the calculated distances and already-known location information of the plurality of the wireless LAN access points;
- determining whether the customer has arrived close to a location where the target product is displayed by determining whether the location of the mobile terminal apparatus is within a certain range of distance from the target product based on the identified location of the mobile terminal apparatus and location information of the target product; and
- returning the emission color of the lighting apparatus to an original color in a case where the customer has been determined to have arrived close to the location where the target product is displayed.

6. A non-transitory computer-readable medium storing a program for causing a management apparatus to perform:
- receiving identification information of a target product that is designated by a customer;
- identifying a lighting apparatus that is associated with the target product, by referring to a data table associating the identification information of the target product and the lighting apparatus installed above the target product;
- changing an emission color of the lighting apparatus to a pre-specified emission color;
- calculating distances between the search apparatus and a plurality of wireless LAN access points installed in the room by using intensities of radio waves received from the plurality of wireless LAN access points via the mobile terminal apparatus;
- identifying a location of the mobile terminal apparatus based on the calculated distances and already-known location information of the plurality of the wireless LAN access points;
- determining whether the customer has arrived close to a location where the target product is displayed by determining whether the location of the mobile terminal apparatus is within a certain range of distance from the target product based on the identified location of the mobile terminal apparatus and location information of the target product; and
- returning the emission color of the lighting apparatus to an original color in a case where it the customer has been determined to have arrived close to the location where the target product is displayed.

* * * * *